(12) United States Patent
Ye et al.

(10) Patent No.: US 9,699,918 B2
(45) Date of Patent: Jul. 4, 2017

(54) PACKAGE ASSEMBLY AND METHOD FOR MANUFACTURING THE SAME

(71) Applicant: Silergy Semiconductor Technology (Hangzhou) LTD, Hangzhou, ZheJiang Province (CN)

(72) Inventors: Jiaming Ye, Hangzhou (CN); Xiaochun Tan, Hangzhou (CN)

(73) Assignee: Silergy Semiconductor Technology (Hangzhou) LTD., Hangzhou (CN)

( * ) Notice: Subject to any disclaimer, the term of this patent is extended or adjusted under 35 U.S.C. 154(b) by 0 days.

(21) Appl. No.: 14/875,302

(22) Filed: Oct. 5, 2015

(65) Prior Publication Data
US 2016/0113144 A1    Apr. 21, 2016

(30) Foreign Application Priority Data
Oct. 21, 2014 (CN) .......................... 2014 1 0562305

(51) Int. Cl.
| | | |
|---|---|---|
| H05K 3/28 | (2006.01) | |
| H05K 1/18 | (2006.01) | |
| H05K 3/34 | (2006.01) | |
| H05K 7/20 | (2006.01) | |
| H01L 21/48 | (2006.01) | |
| H01L 23/433 | (2006.01) | |

(Continued)

(52) U.S. Cl.
CPC .......... *H05K 3/284* (2013.01); *H01L 21/4871* (2013.01); *H01L 23/4334* (2013.01); *H01L 23/49548* (2013.01); *H01L 23/49575* (2013.01); *H05K 1/181* (2013.01); *H05K 3/3421* (2013.01); *H05K 7/205* (2013.01); *H01L 23/3121* (2013.01); *H01L 23/3135* (2013.01); *H01L 23/49558* (2013.01); *H01L 24/13* (2013.01); *H01L 24/16* (2013.01); *H01L 24/29* (2013.01); *H01L 24/32* (2013.01); *H01L 24/48* (2013.01); *H01L 24/81* (2013.01); *H01L 2224/0401* (2013.01); *H01L 2224/131* (2013.01); *H01L 2224/13111* (2013.01); *H01L 2224/16235* (2013.01); *H01L 2224/16245* (2013.01); *H01L 2224/2919* (2013.01);
(Continued)

(58) Field of Classification Search
CPC ...... H05K 7/205; H05K 1/181; H05K 3/3421; H05K 3/284; H01L 21/4871; H01L 23/4334; H01L 23/49548; H01L 23/49575
USPC ...................................................... 361/709
See application file for complete search history.

(56) References Cited

U.S. PATENT DOCUMENTS

| | | | | |
|---|---|---|---|---|
| 5,147,815 | A * | 9/1992 | Casto ................... | H01L 23/315 257/666 |
| 5,237,205 | A * | 8/1993 | Newman ............. | H01L 21/4882 257/668 |

(Continued)

FOREIGN PATENT DOCUMENTS

EP    0767495 A2 *  4/1997  ....... H01L 23/49555

*Primary Examiner* — Anatoly Vortman
(74) *Attorney, Agent, or Firm* — Michael C. Stephens, Jr.

(57) ABSTRACT

A package assembly can include: (i) a plurality of electrical components stacked on at least two layers; (ii) a lead frame connected to the electrical components by solder interconnection; (iii) an encapsulating compound overlapping a portion of the lead frame and the electrical components to expose portions of leads of the lead frame from the encapsulating compound; and (iv) a heat sink having a first portion arranged between two of the plurality of electrical components, where the heat sink is configured to provide a common heat dissipation path for the electrical components.

20 Claims, 18 Drawing Sheets

(51) Int. Cl.
 *H01L 23/495* (2006.01)
 *H01L 23/31* (2006.01)
 *H01L 23/00* (2006.01)
(52) U.S. Cl.
 CPC ........... *H01L 2224/32145* (2013.01); *H01L 2224/32245* (2013.01); *H01L 2224/48247* (2013.01); *H01L 2224/73265* (2013.01); *H01L 2224/81815* (2013.01); *H01L 2924/00014* (2013.01); *H01L 2924/13055* (2013.01); *H01L 2924/13091* (2013.01); *H01L 2924/14* (2013.01); *H01L 2924/181* (2013.01); *H01L 2924/19042* (2013.01); *H01L 2924/19043* (2013.01); *H01L 2924/19102* (2013.01); *H01L 2924/19103* (2013.01); *H01L 2924/19107* (2013.01)

(56) References Cited

U.S. PATENT DOCUMENTS

| | | | | |
|---|---|---|---|---|
| 5,484,959 | A * | 1/1996 | Burns | H01L 23/4951 174/536 |
| 6,037,661 | A * | 3/2000 | Palagonia | H01L 23/24 257/700 |
| 6,429,513 | B1 * | 8/2002 | Shermer, IV | H01L 23/427 257/714 |
| 6,807,061 | B1 * | 10/2004 | Harris | H01L 23/36 257/707 |
| 6,951,982 | B2 * | 10/2005 | Chye | H01L 24/97 174/350 |
| 7,042,725 | B2 * | 5/2006 | Martin | H01L 23/473 165/80.4 |
| 7,573,136 | B2 | 8/2009 | Jiang et al. | |
| 8,395,251 | B2 * | 3/2013 | Shim | H01L 23/3107 257/666 |
| 8,796,830 | B1 * | 8/2014 | Fjelstad | H01L 23/4952 257/676 |
| 9,136,207 | B2 | 9/2015 | Tan | |
| 9,245,820 | B2 * | 1/2016 | Goldrian | H01L 23/473 |
| 9,373,567 | B2 * | 6/2016 | Tan | H01L 23/49575 |
| 2015/0214141 | A1 | 7/2015 | Ye et al. | |
| 2015/0214200 | A1 | 7/2015 | Tan et al. | |

\* cited by examiner

PACKAGE ASSEMBLY AND METHOD FOR MANUFACTURING THE SAME

RELATED APPLICATIONS

This application claims the benefit of Chinese Patent Application No. 201410562305.1, filed on Oct. 21, 2014, which is incorporated herein by reference in its entirety.

FIELD OF THE INVENTION

The present disclosure generally relates to the field of semiconductor packaging, and more particularly to package assemblies and associated methods of making such assemblies.

BACKGROUND

Semiconductor package continued to increase along with the increasing demand for miniaturization, lightweight packages, and multifunction capabilities, in order to decrease a package volume. Along these lines, package assemblies that include a lead frame and multiple die therein is becoming increasingly common. As such, the particular arrangement and connection methods among multiple die are crucial for the volume and performance of the package assembly.

SUMMARY

In one embodiment, a package assembly can include: (i) a plurality of electrical components stacked on at least two layers; (ii) a lead frame connected to the electrical components by solder interconnection; (iii) an encapsulating compound overlapping a portion of the lead frame and the electrical components to expose portions of leads of the lead frame from the encapsulating compound; and (iv) a heat sink having a first portion arranged between two of the plurality of electrical components, where the heat sink is configured to provide a common heat dissipation path for the electrical components.

DETAILED DESCRIPTION

Figure 1:
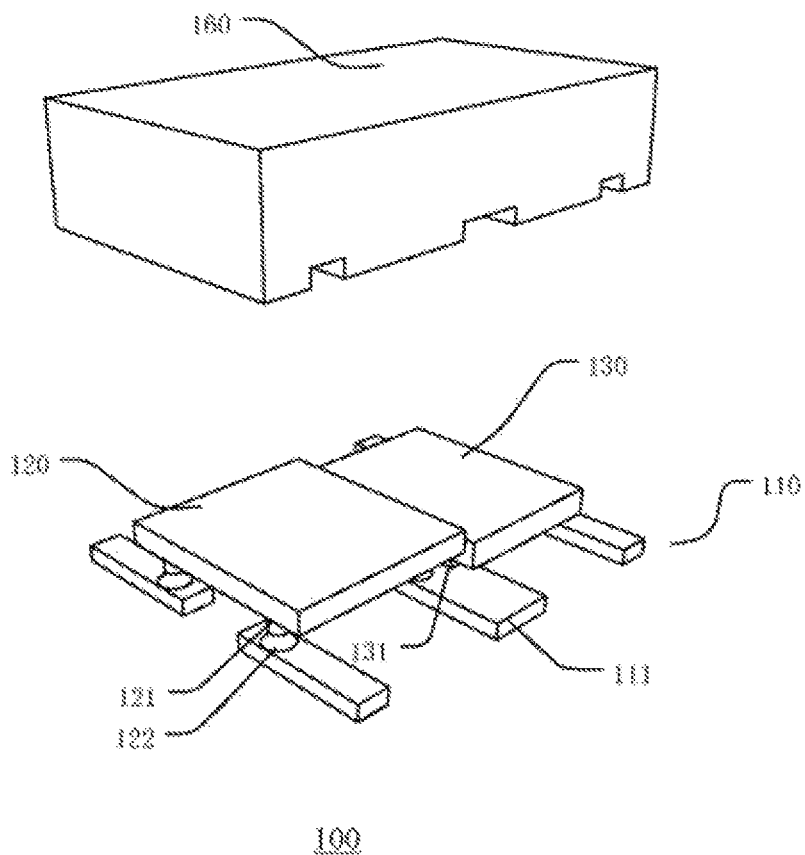
FIG. 1 is a perspective view of an example package assembly with multiple die.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques, such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or "singulating" the finished wafer into the individual die and then packaging the die for structural support and environmental isolation. To singulate the die, the wafer can be scored and broken along non-functional regions of the wafer called saw streets or scribes. The wafer may be singulated using a laser cutting tool or saw blade. After singulation, the individual die can be mounted to a package substrate that includes pins or contact pads for interconnection with other system components. Contact pads formed over the semiconductor die may then be connected to contact pads within the package. The electrical connections can be made with solder bumps, stud bumps, conductive paste, or wire bonds. An encapsulant or other molding material may be deposited over the package to provide physical support and electrical isolation. The finished package can then be inserted into an electrical system, and the functionality of the semiconductor device made available to the other system components.

Referring now to FIG. 1, shown is a perspective view of an example package assembly with multiple die. In this example package assembly 100, two dice 120 and 130 are arranged side by side on lead frame 110 that includes finger leads 111. The top surface of each finger lead 111 may have interconnecting areas. The end of conductive bump 121 at the bottom surface of die 120 can connect to the interconnecting areas of finger leads 111 through solder 122, in order to form solder interconnections. Pads at the bottom surface of die 130 can connect to the interconnecting areas of finger leads 111 through solder 122 in order to form solder interconnections. Encapsulating compound 160 may coat lead frame 110 and die 120 and 130. Further, at least one portion of finger leads 111 of lead frame 110 can be disposed from encapsulating compound 160 in order to provide electrical connection between the package assembly and external circuitry (e.g., printed-circuit boards [PCBs], etc.).

Figure 2A:
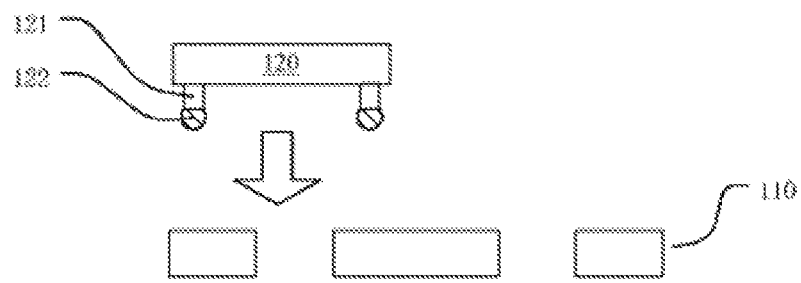
FIGS. 2A-2D are cross-sectional views of each step of an example manufacturing method of the package assembly of FIG. 1.
Figure 2B:
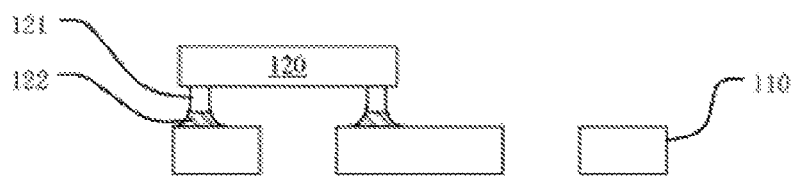
Figure 2C:
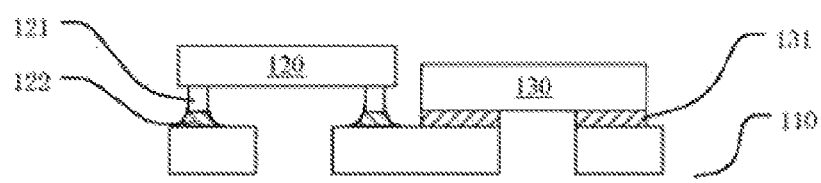
Figure 2D:
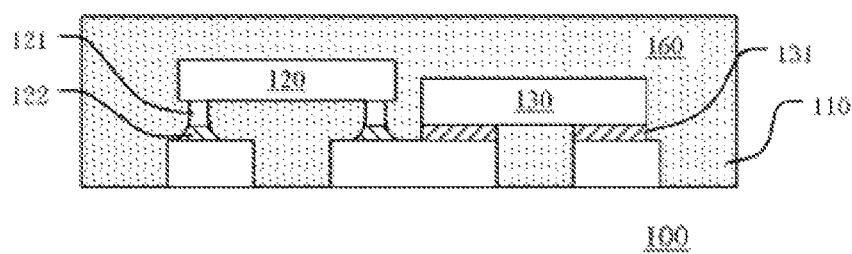

Referring now to FIGS. 2A-2D, shown are cross-sectional views of each step of an example manufacturing method of the package assembly of FIG. 1. As shown in FIG. 2A, die 120 may be arranged on lead frame 110, and solder balls 122 can connect to lead frame 110. When reflowing, solder balls 122 can be melted to form solder, as shown in FIG. 2B. Die 120 may be fixed on corresponding finger leads of lead frame 110 by solder 122. As shown in FIG. 2C, die 130 can be arranged on lead frame 110, and a reflowing process may be performed to fix die 130 on corresponding finger leads of lead frame 110 by solder 131. As shown in FIG. 2D, lead frame 110 and die 120 and 130 may be coated by encapsulating compound 160 (e.g., epoxy, etc.) in order to form package assembly 110.

In this approach, die 120 and 130 are arranged side-by-side on the top surface of lead frame 110, and certain finger leads can be shared by die 120 and 130 to achieve electrical connection. Alternatively, die 120 and 130 can be electrically connected to each other by bonding wires. Because die 120 and 130 are arranged side-by-side, the volume of package assembly 100 may be greater than the sum of the volumes of die 120 and 130, which can to decrease the package density. In addition, because two steps of a reflowing process may be performed before coating die 120 and 130 by encapsulating compound 160, unexpected reflowing of solder 122 of die 120 can occur when the second reflowing process is performed, which may result in defective connections.

In another approach, a package assembly with a plurality of stacked die stacked on one lead frame can be provided. The die at the bottom maybe arranged on the lead frame by solder, and other upper die may be arranged on the top surface of the next lower die by an adhesive layer. Then, the upper die may be electrically connected to the lead frame by bonding wires. Although this type of package assembly can decrease the package volume to some extent, the use of bonding wires in the package assembly may increase process complicity and manufacturing costs. In addition, the package assembly may suffer from relatively poor heat dissipation performance of the upper die, as well as poor electrical connections of the bonding wires.

In the package assembly description herein, one layer or area that is arranged "above" another layer or area can mean that the layer or area is directly on another layer or area, or there are other layers or areas between the two layers/areas. Also, when turned over, one layer/area can be arranged below another layer or area. In addition, the electrical components as described herein can be understood as general encapsulated objects, and may include die (integrated circuits [ICs]) that include integrated components (e.g., resistors, capacitors, inductors, diodes, transistors, etc.), and/or discrete components (e.g., resistors, capacitors, inductors, diodes, transistors, etc.).

In one embodiment, a package assembly can include: (i) a plurality of electrical components stacked on at least two layers; (ii) a lead frame connected to the electrical components by solder interconnection; (iii) an encapsulating compound overlapping a portion of the lead frame and the electrical components to expose portions of leads of the lead frame from the encapsulating compound; and (iv) a heat sink having a first portion arranged between two of the plurality of electrical components, where the heat sink is configured to provide a common heat dissipation path for the electrical components.

Figure 3A:
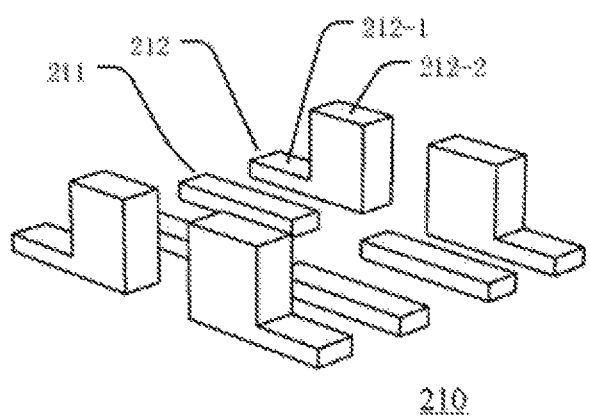
FIGS. 3A and 3B are perspective and plan views of a first example lead frame, in accordance with embodiments of the present invention.
Figure 3B:
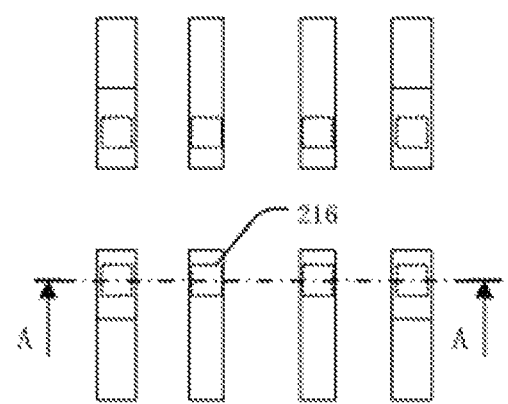

Referring now to FIGS. 3A and 3B, shown are perspective and plan views of a first example lead frame, in accordance with embodiments of the present invention. In this particular example, lead frame 210 may be configured to arrange electrical components at two layers. The following cross-sectional views of the package assembly are along line A-A of FIG. 3B going through interconnection areas 216 of the finger leads. Lead frame 210 can include leads 211 and 212. Interconnecting area 216 can arrange contact solder to be formed on the top surface of the inner end of leads 211 (e.g., in a planar and banded configuration).

Leads 212 can include extension part 212-1 and raised platform 212-2 (e.g., configured as a stepped shape). Interconnecting area 216 can be configured to place contact solder formed on the top surface of platform 212-2. Solder interconnection may be formed between leads 211 and first electrical components at the first layer, and between leads 212 and second electrical components at the second layer, where the second layer is higher than the first layer. The interconnection area of leads 212 can be higher than that of leads 211 in the vertical direction. Leads 212 may be outside of leads 211; therefore, the interconnection area of leads 212 may surround that of leads 211. For example, the bottom surface of leads 211 can be coplanar with that of leads 212 in the stacked or vertical direction.

Figure 4A:
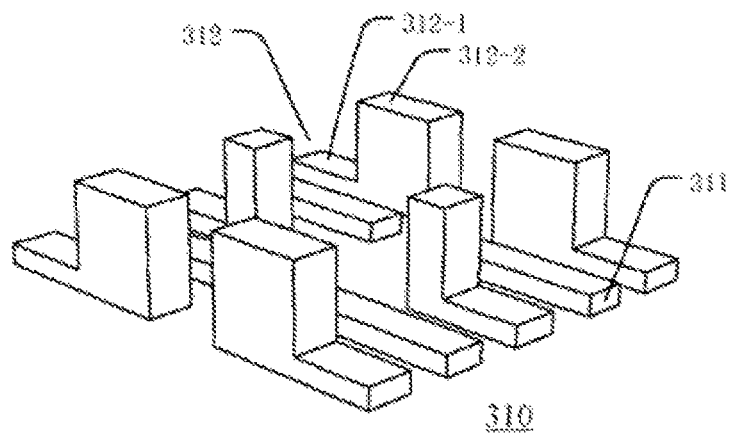
FIGS. 4A and 4B are perspective and plan views of a second example lead frame, in accordance with embodiments of the present invention.
Figure 4B:
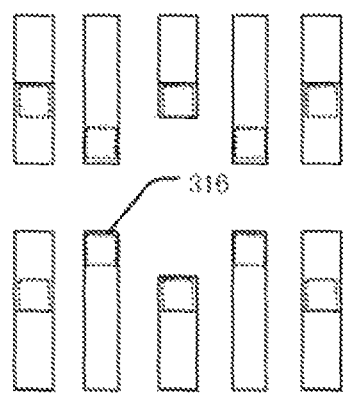

Referring now to FIGS. 4A and 4B, shown are perspective and plan views of a second example lead frame, in accordance with embodiments of the present invention. In this particular example, lead frame 310 can arrange electrical components at two layers. Lead frame 310 can include leads 311 and 312. Interconnecting area 316 may arrange contact solder to be formed on the top surface of the inside terminal of leads 311 (e.g., in a planar and banded configuration). Leads 312 can include extension part 312-1 and raised platform 312-2 (e.g., configured as a stepped shape). Interconnecting area 316 can arrange contact solder to be formed on the top surface of platform 312-2.

Solder interconnection may be formed between leads 311 and first electrical components at the first layer, and between leads 312 and second electrical components at the second layer, where the second layer is higher than the first layer. The interconnection area of leads 312 can be higher than that of leads 311 in the vertical direction. Leads 312 may be outside of leads 311; therefore, the interconnection area of leads 312 can surround that of leads 311. For example, the bottom surface of leads 311 may be coplanar with that of leads 312 in the vertical or stacked direction. In this particular example, in s plane vertical with the stacked direction, leads 312 and 311 can be arranged in an interleaved fashion. The inner end of lead 312 between two of leads 311 may be outside of the interconnection area of leads 311; therefore, the interconnection area of leads 312 can be outside of the interconnection area of leads 311.

Figure 5A:
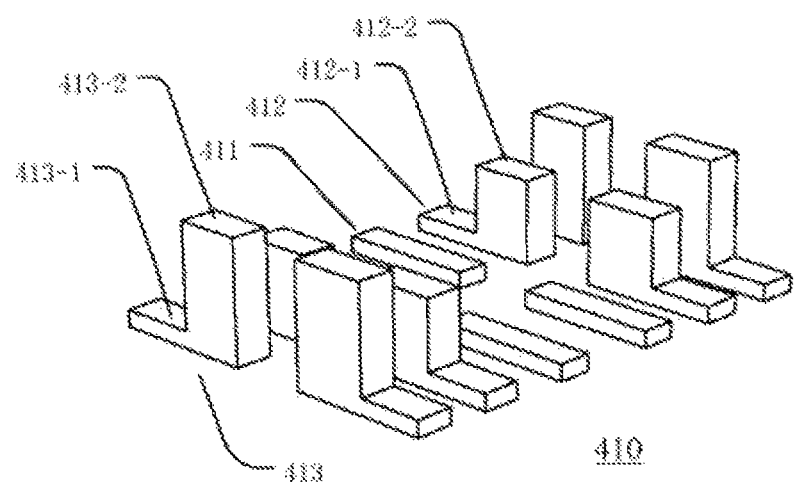
FIGS. 5A and 5B are perspective and plan views of a third example lead frame, in accordance with embodiments of the present invention.
Figure 5B:
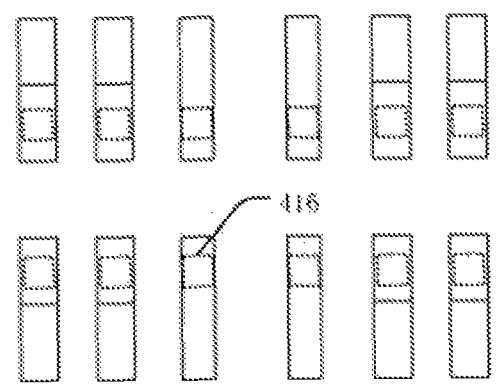

Referring now to FIGS. 5A and 5B, shown are perspective and plan views of a third example lead frame, in accordance with embodiments of the present invention. In this particular example, lead frame 410 can be configured to arrange electrical components at three layers. Lead frame 410 can include leads 411, 412, and 413. Interconnecting area 416 can arrange contact solder to be formed on the top surface of the inner end of leads 411 (e.g., in a planar and banded configuration). Leads 412 can include extension part 412-1 and raised platform 412-2 (e.g., configured as a stepped shape). Interconnecting area 416 can arrange contact solder to be formed on the top surface of platform 412-2. Leads 413 can include extension part 413-1 and raised platform 413-2 (e.g., configured as a stepped shape). Interconnecting area 416 can arrange contact solder to be formed on the top surface of platform 413-2.

Solder interconnection may be formed between leads 411 and first electrical components at the first layer, between leads 412 and second electrical components at the second layer, and between leads 413 and third electrical components at the third layer, which third layer may be higher than the second layer, and the second layer may be higher than the first layer. The interconnection area of the third layer can be higher than that of the second layer, and the interconnection area of the second layer may be higher than the first layer. Leads 413 can be outside of leads 412; therefore, the interconnection area of leads 413 can surround that of leads 412. Leads 412 may be outside of leads 411; therefore, the interconnection area of leads 412 may surround that of leads 411. For example, the bottom surface of leads 411, 412, and leads 413 may be coplanar in a plane vertical with the stacked direction.

As described in the examples above, the lead frame can be configured to mount electrical components of two or three layers, and lead frame applied for more (e.g., 4, 5, etc.) layers can accordingly be provided. The interconnection area of the leads at higher layers may be higher than that of leads at lower layers, and the interconnection area of the leads at higher layers may surround that of leads at lower layers. For example, coating layers can be included by the interconnection area of the leads to improve conductivity and corrosion resistance. For example, the leads can be formed by copper (Cu), and the coating layer can be silver (Ag).

Although the first leads are described above as a planar and banded shape, the first leads can also be stepped shaped with an extension part and a raised platform. Interconnection areas configured to be connected to solder may be formed at the top surface of the platform. The interconnection area of the second leads (e.g., 412) may be higher than that of the first leads (e.g., 411), and the interconnection area of the second leads surrounds that of the first leads. The example lead frames described above can be configured to assembly stacked electrical components in view that interconnection areas of different layers for electrical components can be provided in order to improve the package density. In addition, bonding wires can be reduced or avoided altogether in the package assembly because the electrical components of different layers can be directly connected to the interconnection areas of the lead frame.

Figure 6A:
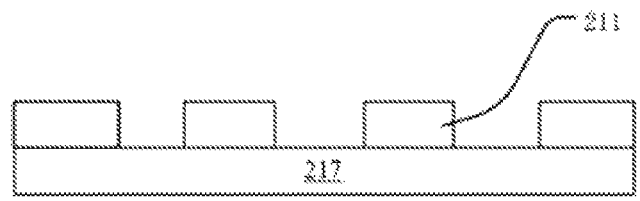
FIGS. 6A-6E are cross-sectional views of an example method of making a fourth example package assembly, in accordance with embodiments of the present invention.
Figure 6B:
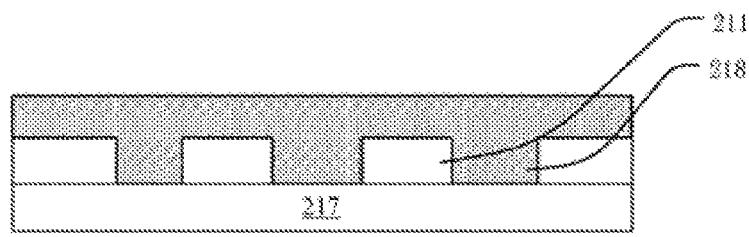

Referring now to FIGS. 6A-6E, shown are cross-sectional views of an example method of making a fourth example package assembly, in accordance with embodiments of the present invention. This particular example method can be employed in forming lead frame 210 shown above. Firstly, a stacked layer including substrate 217 (e.g., iron-nickel alloy), and a metal layer (e.g., copper) can be formed above. For example, substrate 217 can be configured as a support layer, and may be removed as a sacrificed layer. Also for example, the metal layer can be etched and patterned by employment of a first mask in order to form lead 211 of a "banded" shape, as shown in FIG. 6A. In the process of etching, exposed portions of the metal layer can be selectively removed by an etchant, and then the first mask may be removed. An exposed surface of lead 211 and substrate 217 can then be overlapped by encapsulating compound 218 (e.g., epoxy), as shown in FIG. 6B.

Figure 6C:
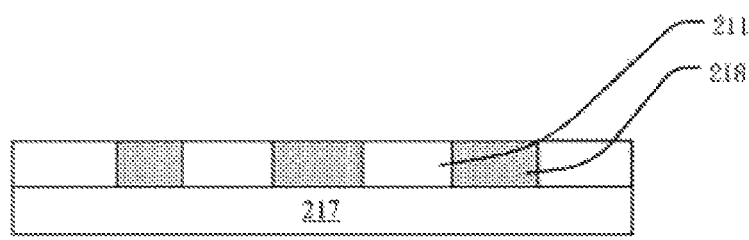
Figure 6D:
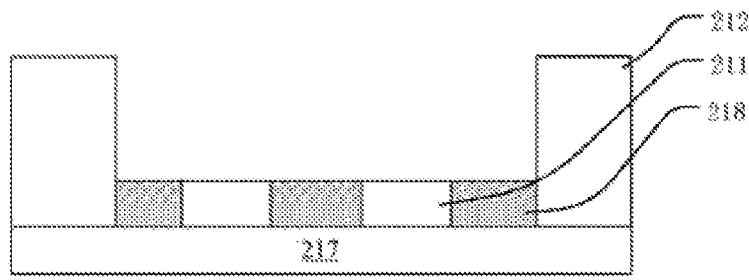
Figure 6E:
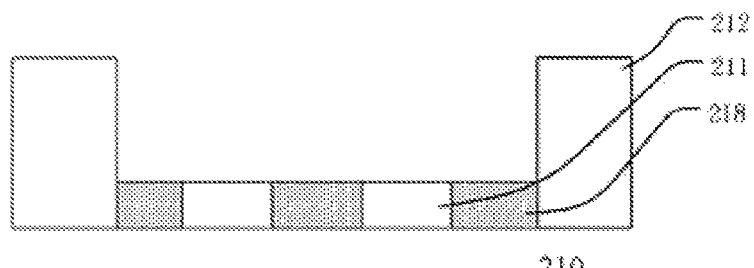

Encapsulating compound 218 may be thick enough to fill up trenches between two leads 211. A top surface of lead 211 can be exposed again by grinding encapsulating compound 218, as shown in FIG. 6C. The full top surface of a first portion of leads 211 and part of the top surface of a second portion of leads 211 may be overlapped by a second mask. The platforms can be formed by plating metal on the exposed surfaces of the second portion of leads 211, as shown in FIG. 6D. The overlapped leads may be configured as leads 211, and the remaining leads with platforms can be configured as leads 212. After plating, the second mask may be removed, and substrate 217 can be removed by an etchant in order to form lead frame 210 that includes leads 211 and 212.

In an alternative example, a metal sheet (e.g., copper) can be originally arranged, and lead frame 210 can be formed by two etching processes. The metal sheet can initially be etched through a first mask; therefore, the overlapped portion of the metal sheet can be configured as the platform of the second leads, and the thickness of the exposed portion of the metal sheet can be decreased. Secondly, the metal sheet can be etched through a second mask; therefore, the overlapped portion of the metal sheet may be configured as the first lead and the second lead, and the exposed portion of the metal sheet can be completely removed to form trenches between two leads. In another alternative example, a metal sheet (e.g., copper can be initially arranged, and lead frame 210 can be formed by a stamping process by available molds.

Figure 7:
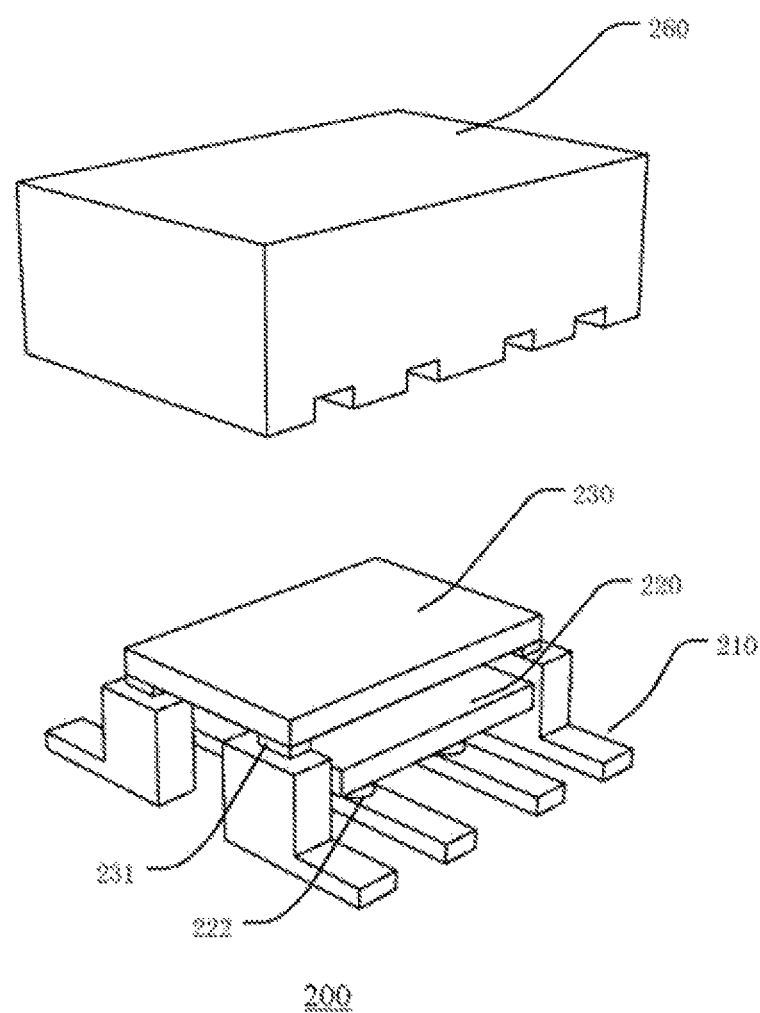
FIG. 7 is an exploded perspective view of a fifth example package assembly, in accordance with embodiments of the present invention.

Referring now to FIG. 7, shown is an exploded perspective view of a fifth example package assembly, in accordance with embodiments of the present invention. Lead frame 210 can be utilized in package assembly 200. Lead frame 210 can include a plurality finger leads with interconnection areas in the package assembly. In this particular drawing, encapsulating compound 260 and other parts of package assembly 200 are apart to show details of package assembly 200. To be understood, encapsulating compound 260 is part of package assembly 200, and encapsulating compound 260 together with other parts may form package assembly 200.

Die 220 and 230 can be stacked on lead frame 210. Each of die 220 and 230 can include internal circuits (e.g., a switching voltage regulator), and conductive bumps connected the internal circuits. The first leads (e.g., 211) of lead frame 210 can be in a planar and banded shape, and an interconnection area may be arranged on the top surface of the inner ends of the first leads connected to solder 222 (e.g., Sn). Die 220 may be fixed on lead frame 210 by solder 222. The second leads (e.g., 212) of lead frame 210 can be in a stepped shape including an extension part and a raised platform. The interconnection area can be arranged on the top surface of the platform to be connected to solder 231 (e.g., Sn). Die 230 can be fixed on lead frame 210 by solder 231. The size of die 230 can be larger than that of die 220, and arranged above die 220. Encapsulating compound 260 may overlap die 220, die 230, and lead frame 210. Leads of lead frame 210 can be exposed from encapsulating compound 260 in order to provide electrical connection between the package assembly and external circuitry (e.g., via a PCB).

Figure 8:
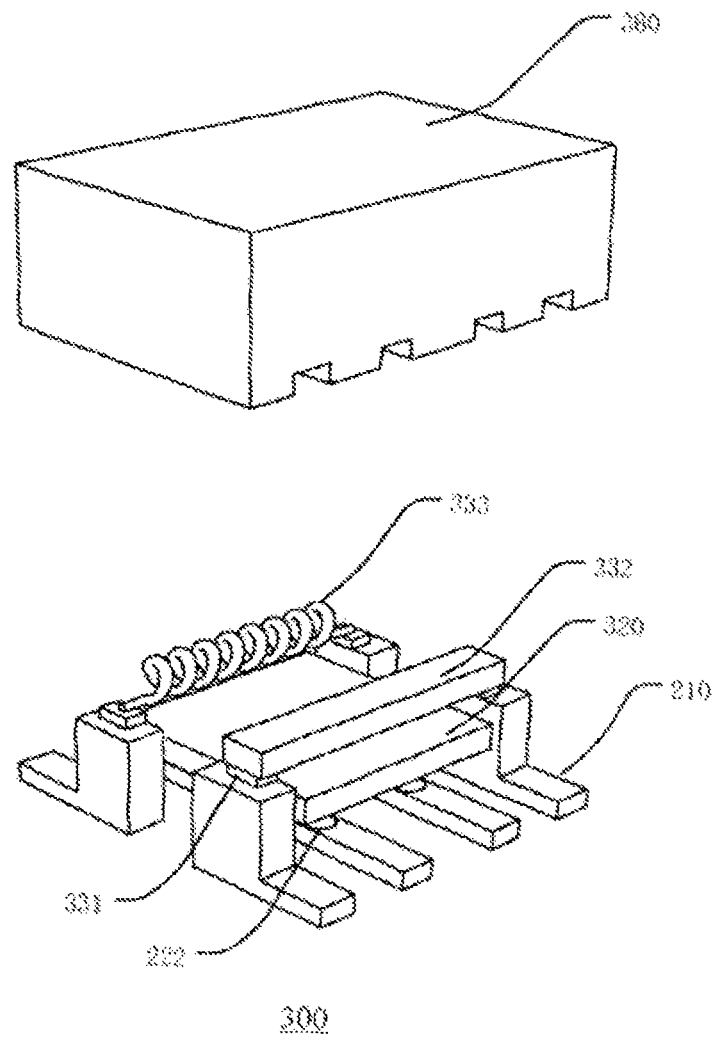
FIG. 8 is an exploded perspective view of a sixth example package assembly, in accordance with embodiments of the present invention.

Referring now to FIG. 8, shown is an exploded perspective view of a sixth example package assembly, in accordance with embodiments of the present invention. In this particular example, package assembly 300 may utilise lead frame 210 shown above. Lead frame 210 can include a plurality finger leads with interconnection areas in the package assembly. In this particular example package assembly 300, the upper electrical component may not be an integrated circuit or die, but rather two discrete components (e.g., resistor 332 and inductor 333). Resistor 332 and inductor 333 can be stacked above die 320, and together with die 320 may be assembled on lead frame 210. Die 320 can include internal circuits and conductive bumps connected to the internal circuits. The first leads of lead frame 210 can be in a planar and banded shape, and interconnection areas may be arranged on the top surface of the inner ends of the first leads connected to solder 322 (e.g., Sn).

Die 220 can be fixed on lead frame 210 by solder 322. The second leads of lead frame 210 can be in a stepped shape including an extension part and a raised platform. The interconnection area can be arranged on the top surface of the platform to be connected to solder 331 (e.g., Sn). Resistor 332 and inductor 333 can be fixed on lead frame 210 by solder 331. The length of resistor 332 and inductor 333 may be greater than that of die 220, and arranged above die 220. Encapsulating compound 360 can overlap die 220, resistor 332, inductor 333, and lead frame 210. Leads of lead frame 210 can be exposed from encapsulating compound 360 in order to provide electrical connection between the package assembly and external circuitry (e.g., via a PCB).

Figure 9:
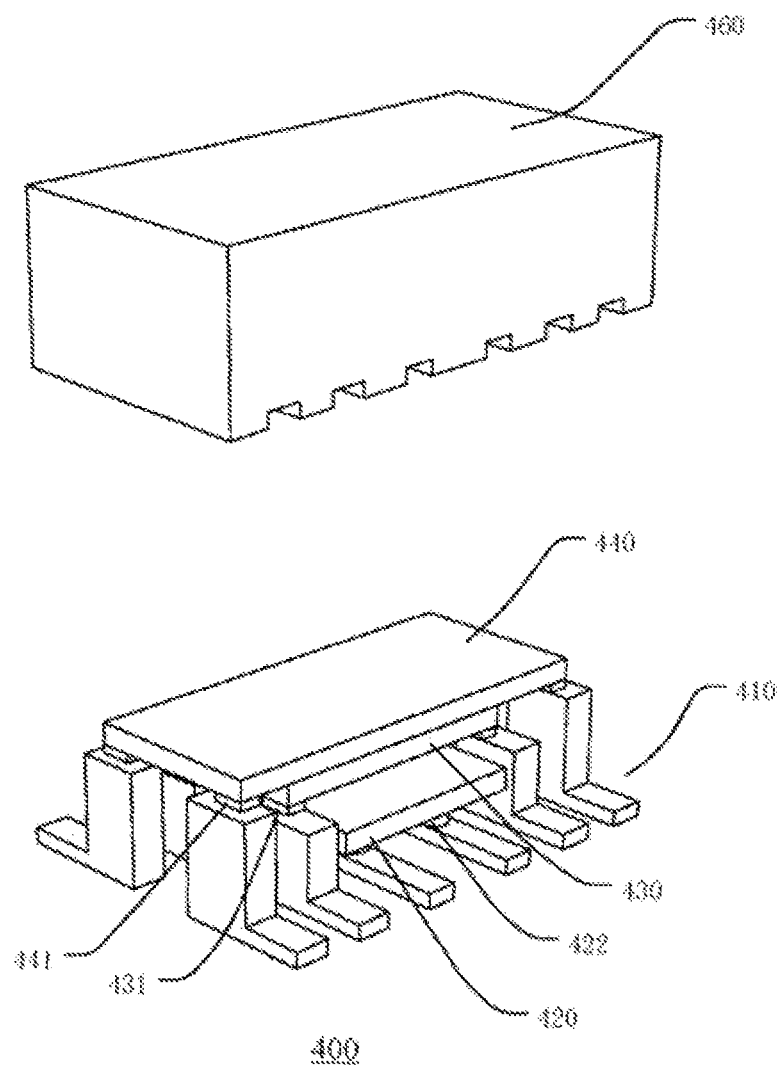
FIG. 9 is an exploded perspective view of a seventh example package assembly, in accordance with embodiments of the present invention.

Referring now to FIG. 9, shown is an exploded perspective view of a seventh example package assembly, in accordance with embodiments of the present invention. In this particular example, package assembly 400 may utilise lead frame 410. Lead frame 410 can include finger leads with interconnection areas in the package assembly. In this particular example, package assembly 400 can include three die: 420, 430, and 440, that are stacked in lead frame 410. Each of die 420, 430, and 440 can include internal circuits and conductive bumps connected the internal circuits. The first leads of lead frame 410 can be any planar and banded shape, and interconnection areas may be arranged on the top surface of the inner ends of the first leads connected to solder 222 (e.g., Sn). Die 420 can be fixed on lead frame 410 by solder 422. The second leads of lead frame 410 may be in a stepped shape including an extension part and raised platform. The interconnection area can be arranged on the top surface of the platform to be connected to solder 431 (e.g., Sn).

Die 430 can be fixed on lead frame 410 by solder 431. The size of die 430 may be larger than that of die 420, and arranged above die 420. The third leads of lead frame 410 can be in a stepped shape including an extension part and a raised platform. The interconnection area can be arranged on the top surface of the platform to be connected to solder 441 (e.g., Sn). Die 440 can be fixed on lead frame 410 by solder 441. The size of die 440 can be larger than that of die 430, and may be arranged above die 430. Encapsulating compound 460 can overlap die 420, die 430, die 440, and lead frame 410. Leads of lead frame 410 may be exposed from encapsulating compound 460 in order to provide electrical connection between the package assembly and external circuitry (e.g., via a PCB).

Although the package assembly including electrical components of two or three layers is described in the above examples, the package assembly can also include more layers and electrical components. The lead frame can include multiple groups of leads of different layers. The interconnection area of higher layers may be higher than that of lower layers, and the interconnection area of higher layers can surround that of lower layers.

Also in the above example, the discrete components are arranged above the die; however, in other cases the discrete components can be arranged under the die. Further, the size of electrical components of higher layers can be larger than that of lower layers, but in some cases both the length and width of electrical components of the higher layers may not be larger than that of lower layers. The electrical components of different layers can be arranged in different directions in the vertical or stacked direction. Therefore, if one of the length and width of the first electrical components is larger than either one of the length/width of second electrical components, the first electrical components can be arranged on the higher layers and the second electrical components can be arranged on the lower layers.

The number of electrical components of each layer can be greater than one. Also, multiple groups of leads of the lead frame can be configured to provide interconnection areas of different heights to arrange stacked electrical components in order to improve the package density. In addition, bonding wires can be reduced in number or avoided altogether in the package assembly because the electrical components of different layers can be directly connected to the interconnection areas of the lead frame.

Referring now to FIGS. 10A-10F, shown are exploded perspective views of another example package assembly, in accordance with embodiments of the present invention. In these particular examples, heat sink 250 can be included with lead frame 210 in package assemblies 2100-2600. Lead frame 210 can include finger leads with interconnection areas inside the package assembly. Two die 220 and 230 can be stacked on lead frame 210. Each of die 220 and 230 can include internal circuits and conductive bumps connected the internal circuits. The first leads (e.g., 211) of lead frame 210 can be in a planar and banded shape, and interconnection areas can be arranged on the top surface of the inner ends of the first leads connected to solder 222 (e.g., Sn).

Die 220 can be fixed on lead frame 210 by solder 222. The second leads (e.g., 212) of lead frame 210 can be in a stepped shape including an extension part and a raised platform. The interconnection areas can be arranged on the top surface of the platform to be connected to solder 231 (e.g., Sn). Die 230 can be fixed on lead frame 210 by solder 231. The size of die 230 may be larger than that of die 220, and can be arranged above die 220. Encapsulating compound 260 can overlap die 220, die 230, and lead frame 210. Leads of lead frame 210 may be exposed from encapsulating compound 260 in order to provide electrical connection between the package assembly and external circuitry (e.g., via a PCB).

Figure 12:
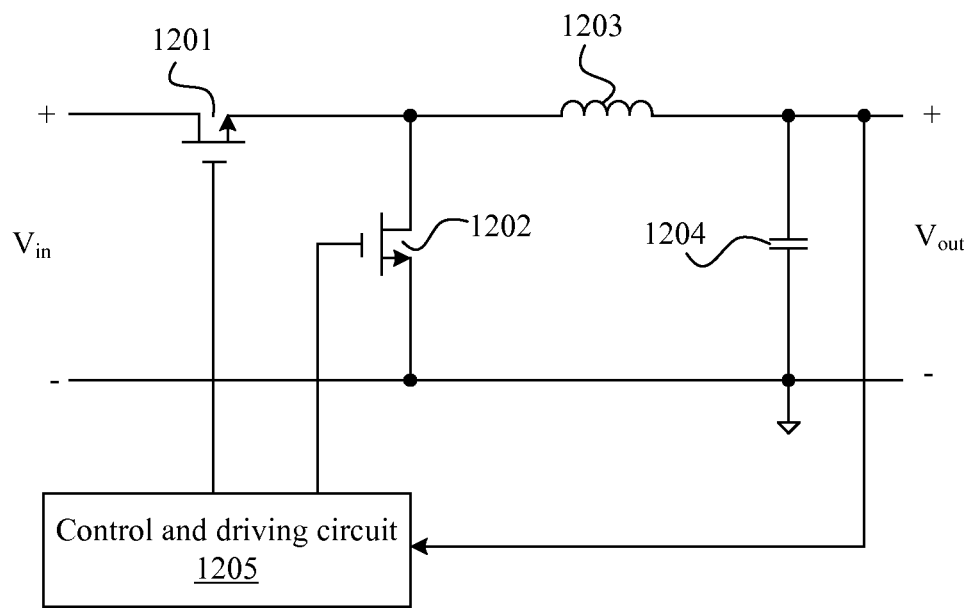
FIG. 12 is a schematic block diagram of an example switching voltage regulator configured for a package assembly, in accordance with embodiments of the present invention.

For example, die 220 can include a power switch of a switching converter, and die 230 can include a driving circuit of the switching converter (see, e.g., FIG. 12). Because large currents may flow through the power switch and the driving circuit, heat can be generated, so package assemblies 2100 to 2600 may include a heat sink shared by die 220 and die 230 in order to provide heat dissipation path for the two die. In package assemblies 2100 to 2600, heat sink 250 can include a first portion between die 220 and die 230. The bottom surface of the first portion can connect to a heat transmission medium (e.g., heat transmission layer, heat transmission path, heat transmission adhesive, etc.), and the top surface can connect to a heat transmission medium (e.g., heat transmission layer, heat transmission path, heat transmission adhesive, etc.).

Figure 10A:
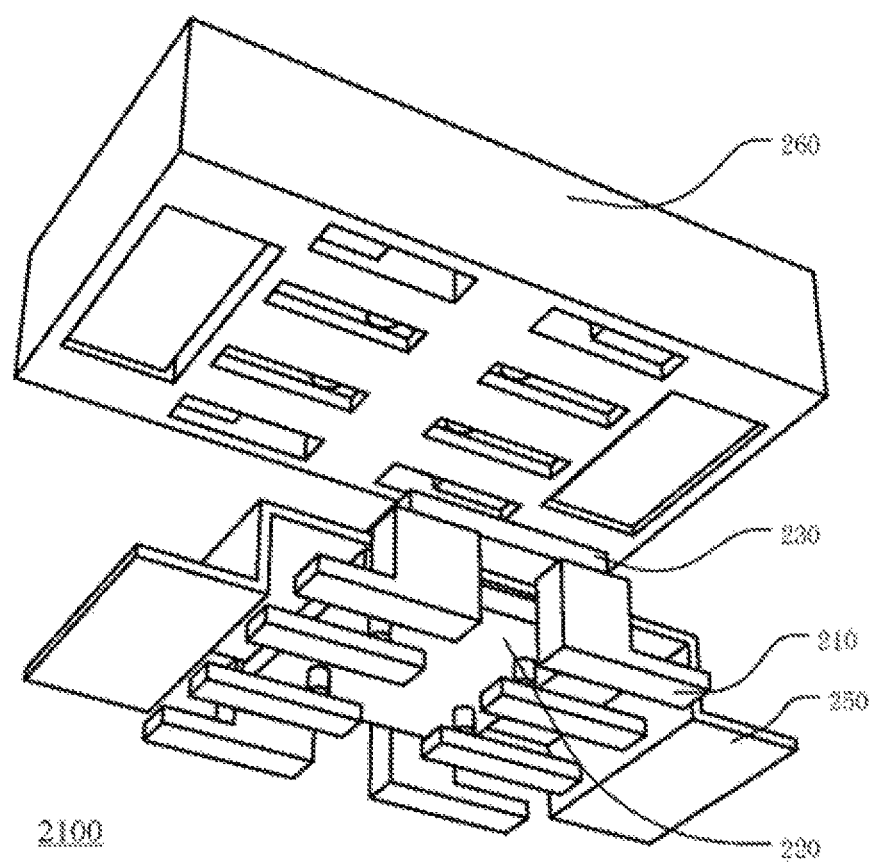
FIGS. 10A-10F are exploded perspective views of another example package assembly, in accordance with embodiments of the present invention.

Therefore, the first portion of heat sink 250 can be configured as part of the common heat dissipation path of the two die. Heat sink 250 can further include a second portion extended to at least one surface of encapsulating compound 260 from the first portion, and a third portion exposed from at least one surface of encapsulating compound 260. In package assembly 2100, the second portion of heat sink 250 can be extended to the bottom surface of encapsulating compound 260 vertically, and the third portion may be exposed from the bottom surface of encapsulating compound 260, as shown in FIG. 10A.

Figure 10B:
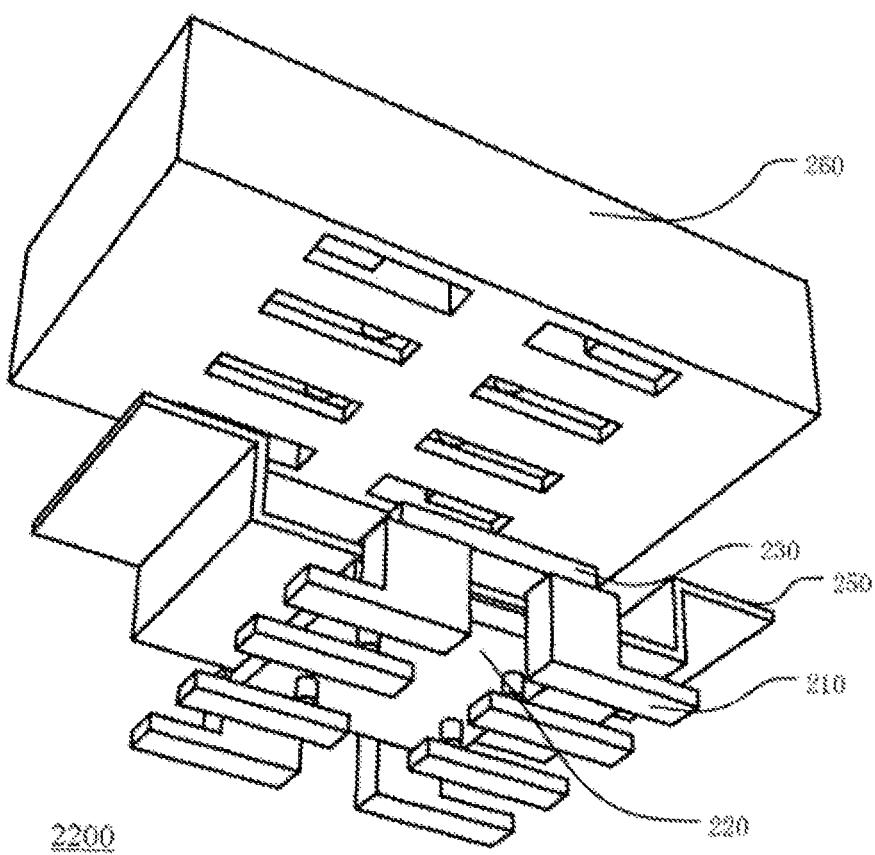
Figure 10C:
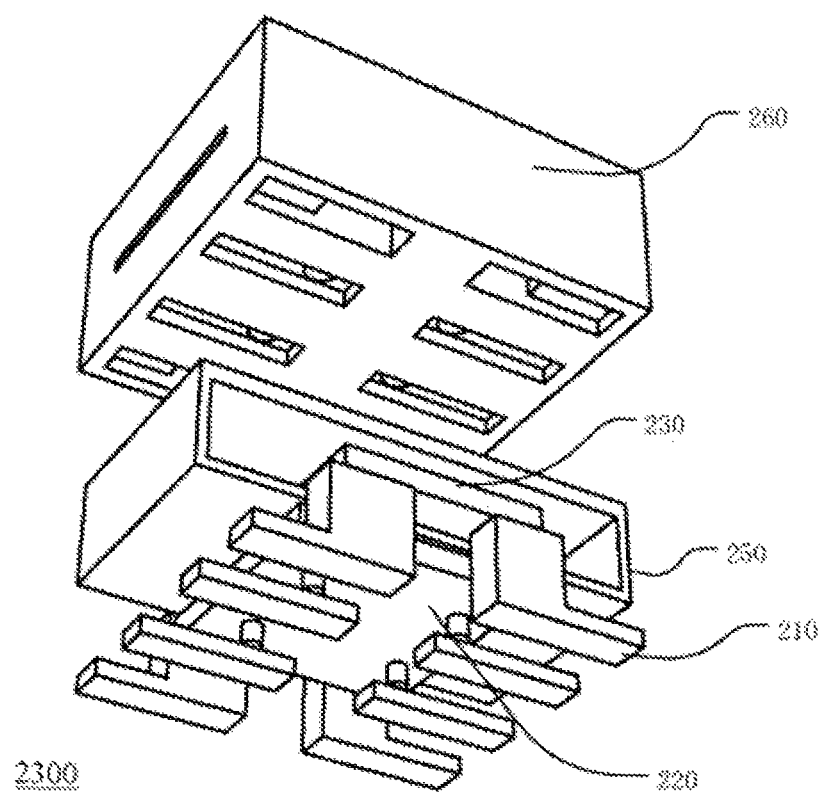

In FIG. 10B, package assembly 2200 can include a second portion of heat sink 250 that is extended to the top surface of encapsulating compound 260 vertically, and the third portion exposed from the top surface of encapsulating compound 260. In package assembly 2300, as shown in FIG. 10C, the second portion of heat sink 250 can be extended to the opposite side of encapsulating compound 260 horizontally, and the third portion may be exposed from the upper part of the opposite surfaces and the top surface of encapsulating compound 260.

Figure 10D:
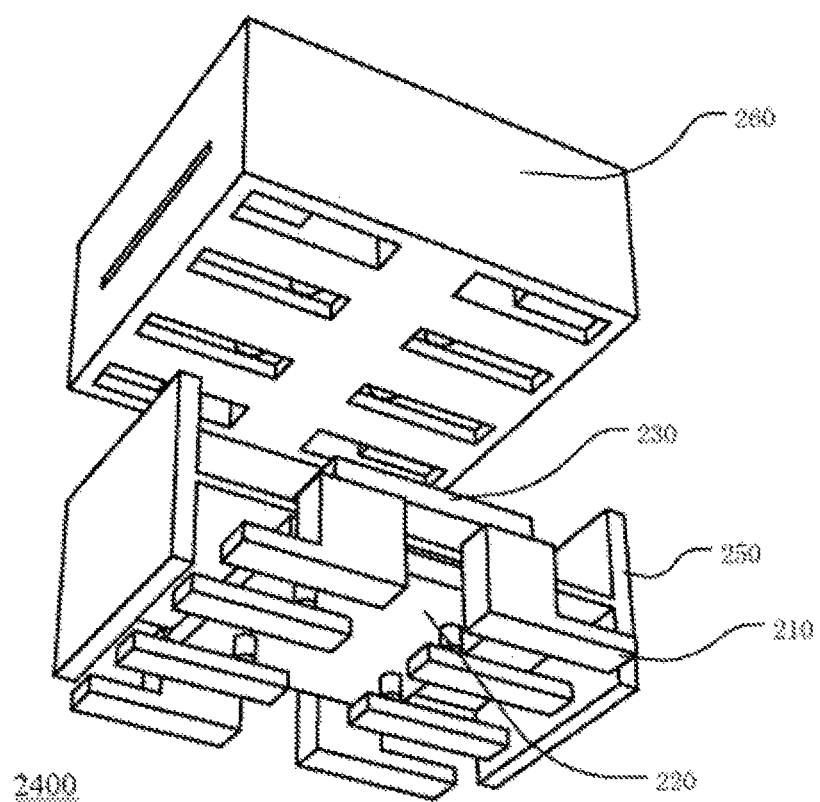
Figure 10E:
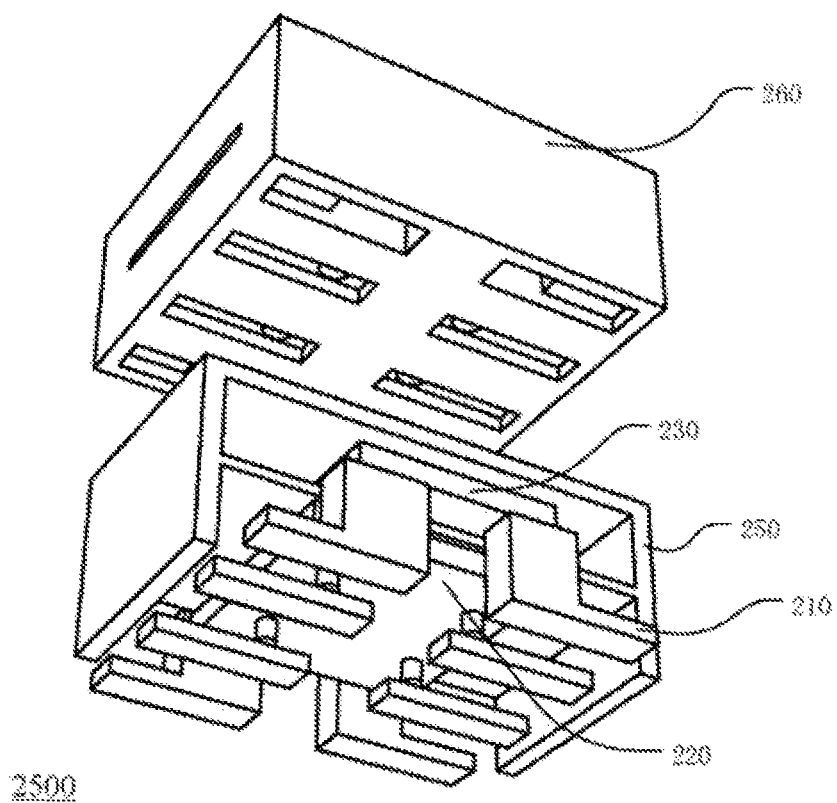

In package assembly 2400, as shown in FIG. 10D, the second portion of heat sink 250 may be extended to the opposite surfaces of encapsulating compound 260 horizontally, and the third portion can be exposed from the full opposite surfaces of encapsulating compound 260. In package assembly 2500, as shown in FIG. 10E, the second portion of heat sink 250 may be extended to opposite surfaces of encapsulating compound 260 horizontally, and the third portion can be exposed from the full opposite surfaces and the top surface of encapsulating compound 260.

Figure 10F:
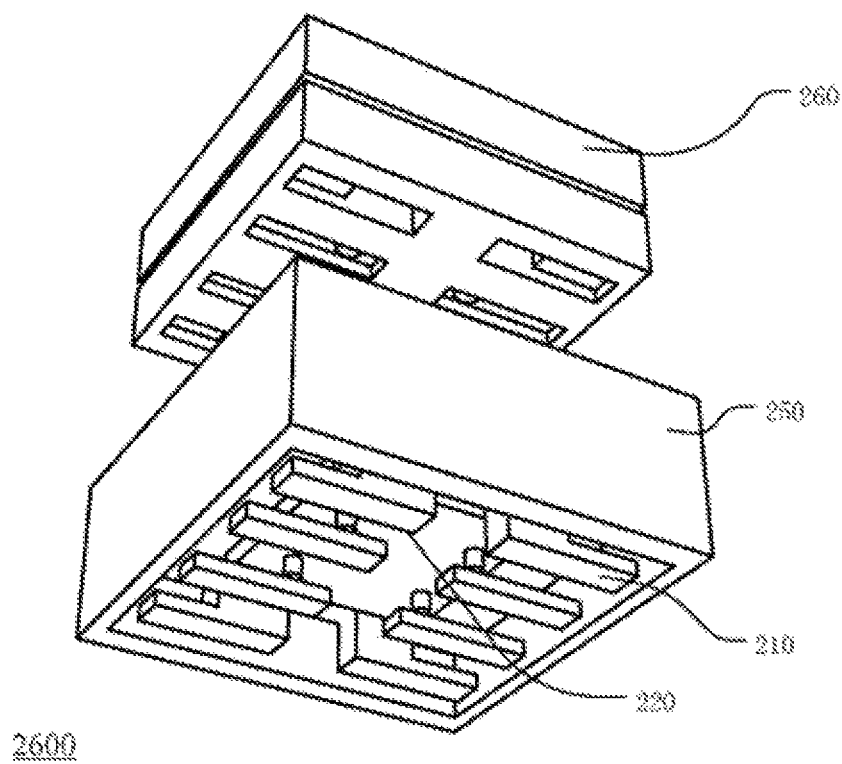

In package assembly 2600, as shown in FIG. 10F, the second portion of heat sink 250 can be extended to opposite surfaces of encapsulating compound 260 horizontally, and the third portion may be exposed from the entire four side surfaces and the top surface of encapsulating compound 260. Alternatively, the second portion of heat sink 250 can be extended to side surfaces of any amount and/or top or bottom surfaces spaces for the second portion of heat sink 250 between platforms of leads of lead frame 210 are available.

For example, heat sink 250 can be a metal component formed integrally, such as copper. Alternatively, heat sink 250 can include two or more metal components to facilitate the arrangement of lead frame 210, die 220, die 230, and heat sink 250 layer-by-layer. The different components of heat sink 250 can be bonded or welded together. One metal component of heat sink 250 can be one of the first portion, second portion, or third portion, or part of the first portion, second portion, or third portion. Further, leads of lead frame 210 can be exposed from the side surface or bottom surface of encapsulating compound 260. When leads of lead frame 210 and the third portion of heat sink 250 are exposed from the same surfaces of encapsulating compound 260, leads of lead frame 210 may be exposed from this surface because heat sink 250 is outside of the leads of lead frame 210.

Heat sink 250 can be employed by package assemblies 2100 to 2600 in order to provide common heat dissipation for two die in accordance with the above examples. The second portion of heat sink 250 can be extended to at least one surface of encapsulating compound 260, and the third portion may be exposed from one surface of encapsulating compound 260 to make full use of surfaces of encapsulating compound 260, in order to provide heat dissipation area. The third portion of heat sink 250 can be connected to external heatsink and PCB, to further increase the heat dissipation area.

Figure 11A:
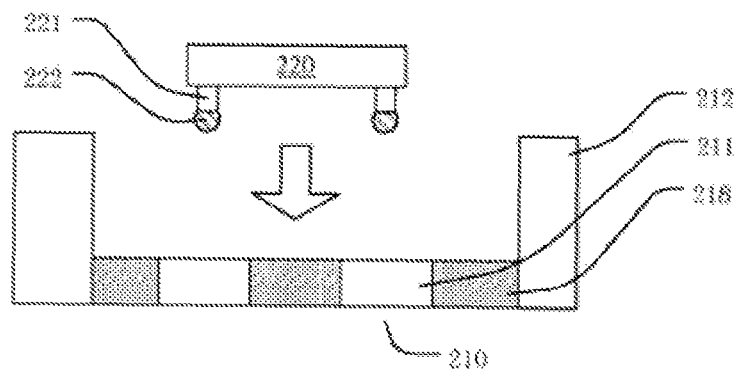
FIGS. 11A-11F are cross-sectional views of another example method of making a package assembly, in accordance with embodiments of the present invention.

Referring now to FIGS. 11A-11F, shown are cross-sectional views of another example method of making a package assembly, in accordance with embodiments of the present invention. Lead frame 210 can include finger leads, and adjacent leads may be separated by encapsulating compound 218. For example, package assembly 200 can be formed by this example method. Each lead of lead frame 210 can include interconnection area in the package assembly. Die 220 may be arranged on lead frame 210, as shown in FIG. 11A. The internal circuitry of die 220 can connect to conductive bump 221 through conductive channels. Solder balls 222 can be arranged on the end of conductive bump 221, and can connect to interconnection areas of lead frame 210.

Figure 11B:
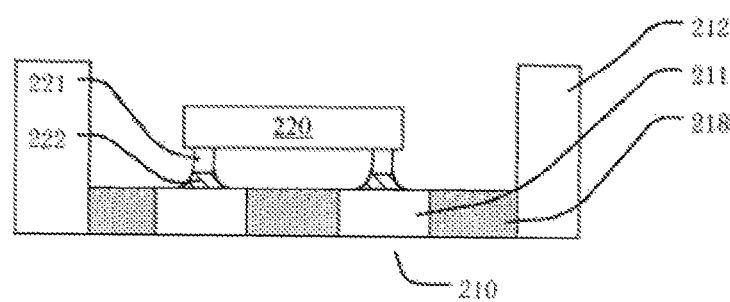
Figure 11C:
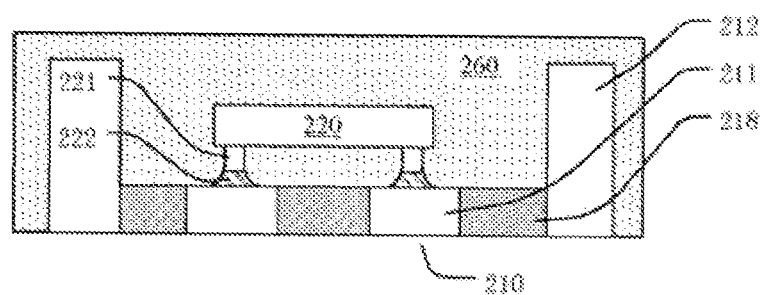
Figure 11D:
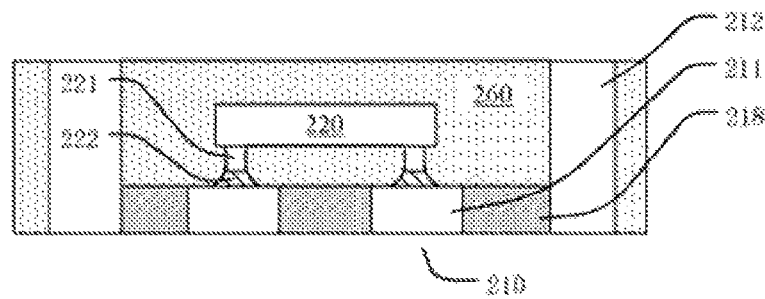
Figure 11E:
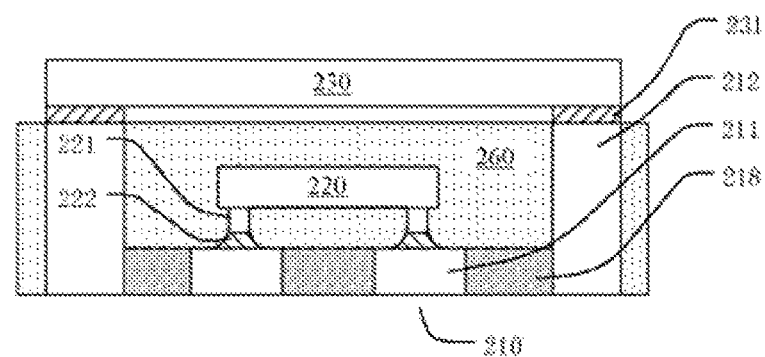
Figure 11F:
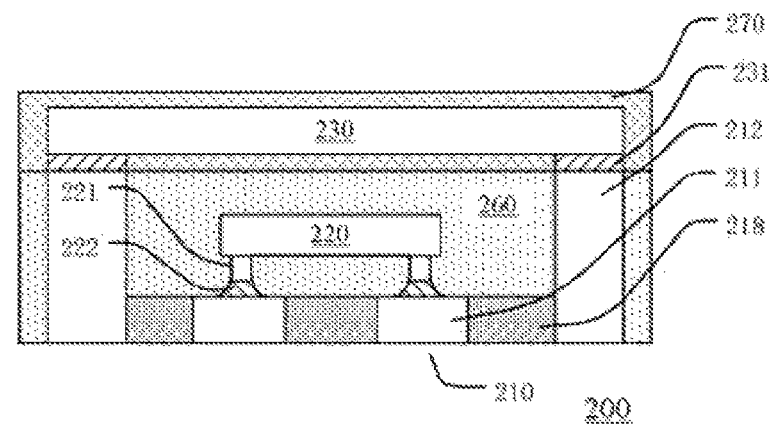

After a reflowing process, solder ball 222 can be melted to be solder 222, as shown in FIG. 11B. Die 220 may be fixed on first lead 211 of lead frame 210 through solder 222. Die 220 can then be overlapped by encapsulating compound 260 (e.g., epoxy), as shown in FIG. 11C. The top surface of second lead 212 may be exposed by grinding encapsulating compound 260, as shown in FIG. 11D. Die 230 may be arranged on lead frame 210. Second die can be fixed on second lead 212 of lead frame 210 by solder 231 after a reflowing process, as shown in FIG. 11E. Lead frame 210, and die 220 and 230, can be encapsulated by encapsulating compound 270 (e.g., epoxy). For example, encapsulating compound 270 can be grounded to decrease the thickness, in order to decrease the package volume and improve the heat dissipation efficiency. Package assembly 200 can be formed, as shown in FIG. 11F.

Die 220 and solder 222 can be protected by encapsulating compound 260 prior to the second reflowing process, in order to improve interconnection reliability. In an alternative example, as an optional step, between the example steps of FIGS. 11B and 11C, heat sink 250 can be arranged as per FIG. 10A. Then, the bottom surface of the first portion of heat sink 250 can connect to die 220. In step of FIG. 11D, when grinding encapsulating compound 260, the top surface of the first portion of heat sink 250 may be exposed. Between the example steps of FIG. 11D and FIG. 11E, the top surface of the first portion of heat sink 250 can connect to die 230. Package assembly 2100 of the example of FIG. 10A can be achieved therefrom.

In another alternative example, after the step of arranging die 220, die 230 can be arranged directly. The first reflowing process of FIG. 11B, the encapsulating step of FIG. 11C, and grinding step of FIG. 11D can be omitted in this particular case. After all die are arranged, one reflowing process may be performed. Therefore, die 220 can be fixed on first lead 211 of lead frame 210 by solder 222, and die 230 may be fixed on second lead 212 of lead frame 210 by solder 231. Then, lead frame 210, and die 220 and 230 can be encapsulated by encapsulating compound (e.g., epoxy) to form package assembly 200. In this particular case, only one reflowing process need be performed for electrical components of multiple layers, potentially simplifying the manufacturing process.

Referring now to FIG. 12, shown is a schematic diagram of an example switching voltage regulator that includes power devices/structures as described herein. A switching voltage regulator is just one example of the circuitry that can be wholly or partially fabricated in the semiconductor structure and/or using processes of particular embodiments. In this example, power transistors 1201 and 1202, inductor 1203, and capacitor 1204 can form a synchronous buck power stage circuit. In other cases, other types of power stage or converter circuits (e.g., flyback, SEPIC, boost, buck-boost, etc.) can be formed. Control and driving circuit 1205 (e.g., including a pulse-width modulation [PWM] controller) can receive an output signal of the power stage circuit, to form a closed-loop feedback control loop to control the switching state of power transistors 1201 and 1202. In this way, the output signal of the power stage circuit can be controlled to be substantially constant.

Of course, other integration or grouping of circuitry into different chips, ICs, or wafers can be accommodated in particular embodiments. In one example, a multi-chip packaging structure in particular embodiments can include power transistors 1201 and 1202 being integrated into a power device chip, and control and driving circuit 1205 being integrated into a control chip. Since the power device may process a high voltage and/or a high current, the power device chip with a large area can be able to withstand a relatively high voltage and a relatively high current. Also, the power device may have good thermal characteristics for power supply integration.

For the integrated circuit of the switching voltage regulator shown in FIG. 12, if the carrying capacity of power transistor 1202 is greater than that of power transistor 1201, power transistor 1202 may be much larger than power transistor 1201. Thus, power transistor 1202 (e.g., the synchronous power device) can be integrated in a single synchronous power device chip, and power transistor 1201 (e.g., the main power device) as well as control and driving circuit 1205 can be integrated in another single mixed chip. Further, power transistors 1201 and/or 1202 can be any suitable types of transistors or devices (e.g., super-junction MOS transistors, VDMOS, LDMOS, IGBT, etc.).

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A package assembly, comprising:
   a) first and second electrical components stacked on first and second layers;
   b) a lead frame comprising a plurality of leads, and being electrically connected to said first and second electrical components;
   c) an encapsulating compound overlapping a portion of said lead frame and said first and second electrical components to expose portions of said plurality of leads of said lead frame from said encapsulating compound; and
   d) a heat sink having a first portion arranged between heat transmission mediums of said first and second electrical components, a second portion extending from said first portion to a surface of said encapsulating compound, and a third portion extending from said second portion and being exposed at said surface of said encapsulating compound, wherein said heat sink provides a common heat dissipation path for said first and second electrical components.

2. The package assembly of claim 1, wherein said heat sink
   (b) is connected to said heat transmission mediums of said first and second electrical components.

3. The package assembly of claim 1, wherein a first surface of said heat sink is connected to said first electrical component on said first layer, and a second surface of said heat sink is connected to said second electrical component on said second layer such that said first portion of said heat sink provides said common heat dissipation path for said electrical components.

4. The package assembly of claim 1, wherein said first portion of said heat sink is directly connected to one of said first and second electrical components.

5. The package assembly of claim 1, wherein said first portion of said heat sink is parallel to said first and second layers.

6. The package assembly of claim 1, wherein each of said heat transmission mediums comprises a heat dissipation adhesive.

7. The package assembly of claim 1, wherein said first portion of said heat sink comprises a metal component.

8. The package assembly of claim 1, wherein said second portion of said heat sink comprises a metal component.

9. The package assembly of claim 7, wherein said third portion of said heat sink comprises a metal component.

10. The package assembly of claim 1, wherein said first and second electrical components comprises a resistor.

11. The package assembly of claim 1, wherein said first and second electrical components comprises a capacitor.

12. The package assembly of claim 1, wherein each of said first and second electrical components comprises a semiconductor die.

13. The package assembly of claim 1, wherein said first and second electrical components comprises a diode, and a transistor.

14. The package assembly of claim 1, wherein said second portion is perpendicular to said first portion.

15. The package assembly of claim 1, wherein said third portion is perpendicular to said second portion.

16. The package assembly of claim 1, wherein said third portion is parallel to said first portion.

17. The package assembly of claim 1, wherein said lead frame is electrically connected to said first and second electrical components by solder.

18. A method of making a package assembly, the method comprising:
  a) placing solder on an interconnection area of a plurality of leads of a lead frame;
  b) placing a first electrical component on a first layer;
  c) connecting a first surface of a first portion of a heat sink to said first electrical component;
  d) placing a second electrical component on a second layer, wherein said first portion of said heat sink is arranged between heat transmission mediums of said first and second electrical components;
  e) connecting a second surface of said first portion of said heat sink to said second electrical component;
  f) performing a reflowing process to connect said interconnection area of said plurality of leads to said first and second electrical components through said solder; and
  g) overlapping said lead frame and said first and second electrical components by an encapsulating compound to expose a portion of said plurality of leads from said encapsulating compound, wherein said heat sink comprises a second portion extending from said first portion to a surface of said encapsulating compound, and a third portion extending from said second portion and being exposed at said surface of said encapsulating compound, wherein said heat sink provides a common heat dissipation path for said first and second electrical components.

19. A method of making a package assembly, the method comprising:
  a) placing solder on an interconnection area of a first group of a plurality of leads of a lead frame;
  b) placing a first electrical component on a first layer;
  c) performing a reflowing process to connect said interconnection area of said first group of said plurality of leads to said first electrical component of said first layer through said solder;
  d) connecting a first surface of said first portion of said heat sink to said first electrical component of said first layer;
  e) placing solder on said interconnection area of a second group of said plurality of leads;
  f) placing a second electrical component on a second layer, wherein said first portion of said heat sink is arranged between heat transmission mediums of said first and second electrical components;
  g) connecting a second surface of said first portion of said heat sink to said second electrical component of said second layer;
  h) performing a reflowing process to connect said interconnection area of said second group of said plurality of leads to said second electrical component of said second layer through said solder; and
  i) overlapping said lead frame and said first and second electrical components by an encapsulating compound to expose a portion of said plurality of leads from said encapsulating compound, wherein said heat sink comprises a second portion extending from said first portion to a surface of said encapsulating compound, and a third portion extending from said second portion and being exposed at said surface of said encapsulating compound, wherein said heat sink provides a common heat dissipation path for said first and second electrical components.

20. The method of claim 19, wherein said second portion is perpendicular to said first portion.

* * * * *